United States Patent
Ohta et al.

(10) Patent No.: US 11,764,308 B2
(45) Date of Patent: Sep. 19, 2023

(54) THIN-FILM TRANSISTOR AND MANUFACTURING METHOD THEREOF

(71) Applicant: SAKAI DISPLAY PRODUCTS CORPORATION, Sakai (JP)

(72) Inventors: Hiroyuki Ohta, Sakai (JP); Shogo Sako, Sakai (JP); Hisayuki Katoh, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 227 days.

(21) Appl. No.: 17/171,602

(22) Filed: Feb. 9, 2021

(65) Prior Publication Data
US 2021/0257501 A1    Aug. 19, 2021

Related U.S. Application Data

(60) Provisional application No. 62/977,971, filed on Feb. 18, 2020.

(51) Int. Cl.
*H01L 29/786* (2006.01)
*H01L 29/66* (2006.01)

(52) U.S. Cl.
CPC .... *H01L 29/78696* (2013.01); *H01L 29/6675* (2013.01); *H01L 29/66765* (2013.01);
(Continued)

(58) Field of Classification Search
CPC ......... H01L 29/78618; H01L 29/78669; H01L 29/78696; H01L 29/78663; H01L 29/78666; H01L 29/6675; H01L 29/66765
See application file for complete search history.

(56) References Cited

U.S. PATENT DOCUMENTS 5,825,050 A * 10/1998 Hirakawa ......... H01L 29/78669
257/E21.414
8,110,829 B2    2/2012 Cho et al.
(Continued)

OTHER PUBLICATIONS

H. Ou, K. Wang, J. Chen, A. Nathan, S. Z. Deng and N. S. Xu, "Dual-gate photosensitive FIN-TFT with high photoconductive gain and near-UV to near-IR responsivity," 2016 IEEE International Electron Devices Meeting (IEDM), 2016, pp. 32.5.1-32.5.4, doi: 10.1109/IEDM.2016.7838529.*

*Primary Examiner* — Yara B Green
*Assistant Examiner* — Fakeha Sehar
(74) *Attorney, Agent, or Firm* — ScienBiziP, P.C.

(57) ABSTRACT

A body layer formed of a semiconductor layer, the body layer comprising, a first region, a second region, and a channel region positioned therebetween; a channel stopper formed on the channel region; source and drain electrodes electrically connected to the first and second regions via first and second contact layers respectively are provided. Each of the first and second contact layers comprises an impurities-containing first amorphous silicon layer; a thickness of each of the first and second regions is less than a thickness of the channel region; and the first and second regions comprise a second amorphous silicon layer containing impurities in a concentration being less than a concentration of impurities contained in the first amorphous silicon layer. This makes it possible to suppress a photoexcited current and improve the aperture ratio in a case that a display apparatus is configured.

12 Claims, 8 Drawing Sheets

(52) U.S. Cl.
  CPC .. *H01L 29/78618* (2013.01); *H01L 29/78663* (2013.01); *H01L 29/78669* (2013.01)

(56) References Cited

U.S. PATENT DOCUMENTS

| | | | | |
|---|---|---|---|---|
| 8,299,466 | B2* | 10/2012 | Furuta | H01L 29/66765 |
| | | | | 438/149 |
| 8,624,237 | B2* | 1/2014 | Yamazaki | H01L 27/1225 |
| | | | | 257/E29.296 |
| 8,624,321 | B2* | 1/2014 | Yamazaki | H01L 29/78696 |
| | | | | 438/153 |
| 2010/0025679 | A1* | 2/2010 | Yamazaki | H01L 27/1225 |
| | | | | 257/E33.013 |
| 2011/0049518 | A1* | 3/2011 | Noda | H01L 29/66969 |
| | | | | 257/E29.296 |
| 2012/0104384 | A1* | 5/2012 | Choi | H01L 29/78696 |
| | | | | 257/E29.296 |
| 2013/0026574 | A1* | 1/2013 | Nakanishi | H01L 29/78669 |
| | | | | 257/347 |
| 2013/0037806 | A1* | 2/2013 | Hayashi | H01L 29/78669 |
| | | | | 257/E21.409 |
| 2017/0162707 | A1* | 6/2017 | Lv | H01L 29/78621 |
| 2018/0233599 | A1* | 8/2018 | Wang | H01L 29/78648 |

\* cited by examiner

FIG. 10

US 11,764,308 B2

THIN-FILM TRANSISTOR AND MANUFACTURING METHOD THEREOF

CROSS-REFERENCE TO RELATED APPLICATIONS

This application claims priority to and the benefit of priority of U.S. Provisional Application No. 62/977,971, filed on Feb. 18, 2020, the entire contents of which are incorporated herein by reference.

TECHNICAL FIELD

The disclosure relates to a thin-film transistor and a manufacturing method thereof.

BACKGROUND OF THE INVENTION

An amorphous silicon (also called a-Si below) thin-film transistor (also called TFT below) is widely used for a display apparatus such as a liquid crystal display, thanks to a low cost, a low temperature process, and a high OFF resistance thereof. Moreover, the use of a-Si being a material depositable uniformly in a large area is expected to continue even in a large-sized screen display such as 10G (for example, 2950 mm×3400 mm).

Figure 10:
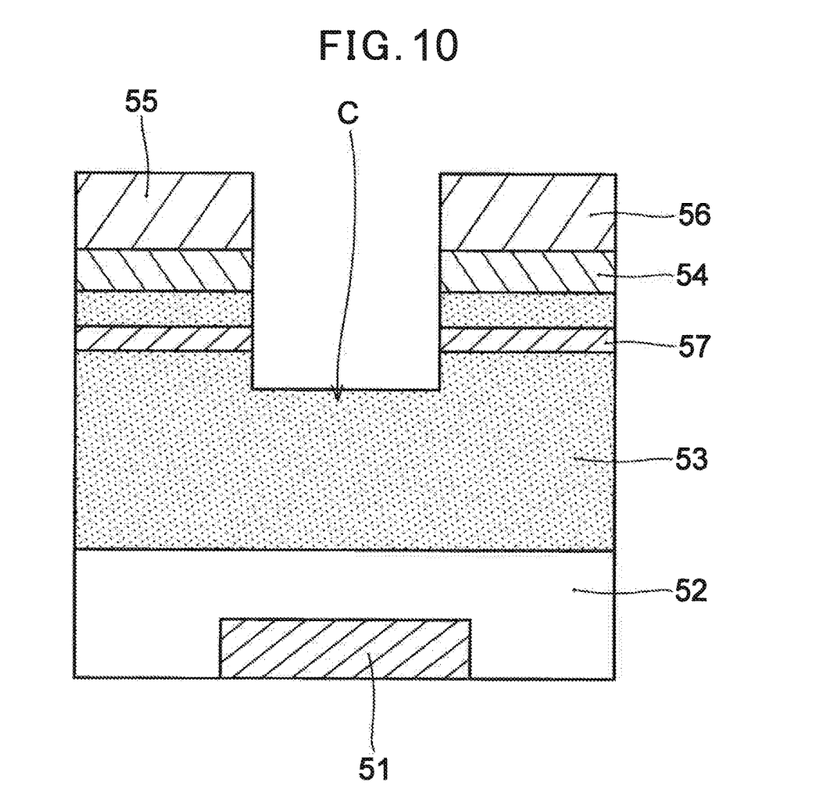
FIG. 10 shows one example of the conventional TFT structure.

As a structure of such a TFT, a structure shown in FIG. 10, for example, is known. In other words, a gate electrode 51 formed of an electrical conductor is formed on an array substrate (not shown), a body layer 53 formed of a-Si and a contact layer 54 formed of n$^+$ a-Si are formed thereover via a first insulating layer 52, and a channel region C is formed by patterning a part of the contact layer 54 and the body layer 53. A source electrode 55 and a drain electrode 56 are formed on the contact layer 54 (see U.S. Pat. No. 8,110,829B2, for example).

In U.S. Pat. No. 8,110,829B2, an n$^-$ a-Si layer 57 is inserted into a part of the body layer 53 to reduce an ON resistance and seek an improvement in ON current and mobility.

SUMMARY OF THE INVENTION

Figure 9:
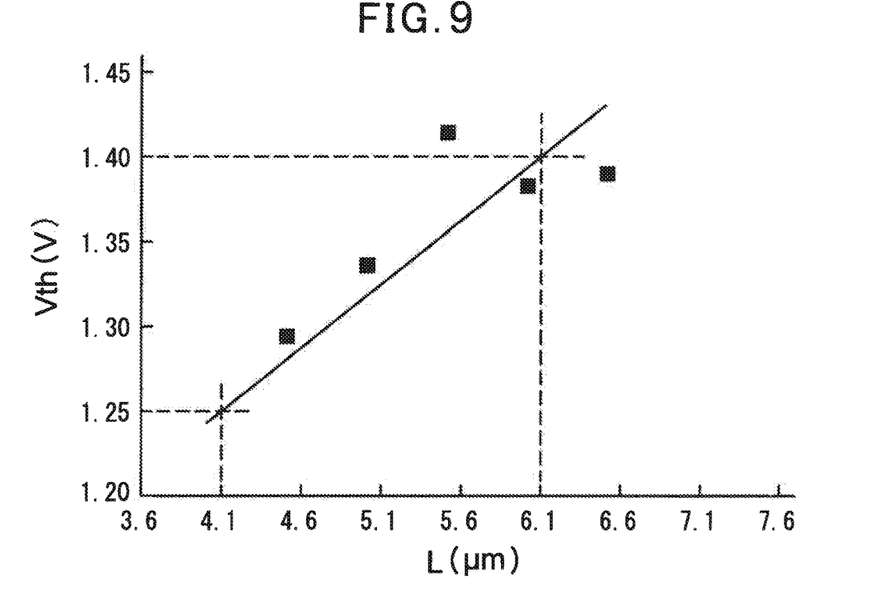
FIG. 9 shows the relationship of a threshold voltage Vth relative to a channel length L in the TFT.

On the other hand, it is known that a-Si produces a photoexcited current, causing a short channel effect. Therefore, there is a problem that it is difficult to reduce a ratio L/W of a channel length L to a channel width W to improve the aperture ratio. In other words, while it is preferable to increase the activated impurities concentration (also called the carrier concentration below) of the contact layer 54 being in contact with the body layer 53 to reduce the photoexcited current, impurities (carriers) of the contact layer 54 formed of n$^+$ a-Si diffuse also into the channel region C of the body layer 53 when channel etching is carried out, so that the impurities concentration of the channel region C of the body layer 53 increases. As shown in FIG. 9, the relationship between the channel length L and a threshold voltage Vth is such that the shorter the channel length L the less the threshold voltage Vth. With the horizontal axis being set as X and the vertical axis being set as Y in FIG. 9, an approximation is given by an equation: Y=(0.15/2)·X+0.9425. Normally, it is considered that at least 1.2V be needed for the threshold voltage Vth, so it is considered that at least 4 μm be needed for the channel length L. The greater the impurities concentration of the channel region C of the body layer 53, the less the threshold voltage Vth. Therefore, the impurities concentration in the channel region C of the body layer 53 cannot be increased excessively.

In view of solving such problems as described above, the disclosure is aimed at providing a thin-film transistor and a manufacturing method thereof that can improve the aperture ratio as a display apparatus by effectively suppressing a photoexcited current and reducing an ON resistance between the source and the drain.

A thin-film transistor according to one embodiment of the disclosure comprises: a substrate; a gate electrode supported by the substrate; a gate insulation layer to cover the gate electrode; a body layer formed of a semiconductor layer formed on the gate insulation layer, the body layer comprising, above the gate electrode, a first region, a second region, and a channel region positioned between the first region and the second region; a channel stopper formed on the channel region of the body layer; a first contact layer formed on the first region of the body layer; a second contact layer formed on the second region of the body layer; a source electrode formed on the first contact layer and electrically connected to the first region via the first contact layer; and a drain electrode formed on the second contact layer and electrically connected to the second region via the second contact layer, wherein each of the first contact layer and the second contact layer comprises an impurities-containing first amorphous silicon layer being in direct contact to the source electrode or the drain electrode; a thickness of each of the first region and the second region of the body layer is less than a thickness of the channel region of the body layer; and each of the first region and the second region of the body layer comprises a second amorphous silicon layer containing impurities in a concentration being less than a concentration of impurities contained in the first amorphous silicon layer.

A manufacturing method for a thin-film transistor according to another embodiment of the disclosure comprises: forming a gate electrode and a first insulation layer, in this order, on a substrate; depositing, on the first insulation layer, a first amorphous silicon film, and a second insulation layer in this order, which first amorphous silicon film is non-doped; forming a channel stopper by patterning the second insulation layer on a portion of the first amorphous silicon film, which portion is to be a channel region; forming a recess in the first amorphous silicon film by etching a portion of the first amorphous silicon film, which portion is not covered by the channel stopper, thereby forming, above the gate electrode, a body layer from the first amorphous silicon film, which body layer comprises a first region, a second region, and the channel region being positioned between the first region and the second region, a thickness of which channel region is greater than a thickness of each of the first region and the second region; depositing a second amorphous silicon film comprising a first amorphous silicon layer above the body layer and the channel stopper, which first amorphous silicon layer is impurities-containing; depositing a conductor layer on the second amorphous silicon film; and forming, from the second amorphous silicon film, a first contact layer being positioned on the first region and a second contact layer being positioned on the second region, and forming, from the conductor layer, a source electrode being in direct contact with the first amorphous silicon layer of the first contact layer and being electrically connected to the first region via the first contact layer and a drain electrode being in direct contact with the first amorphous silicon layer of the second contact layer and being electrically connected to the second region via the second contact layer, by patterning the conductor layer and the second amorphous silicon film.

The thin-film transistor and the manufacturing method therefor according to embodiments of the disclosure allow not excessively increasing the impurities concentration of the body layer while optimally forming the impurities concentration of the body layer on the surface joining the contact layer and the body layer, causing the photoexcited current to be suppressed and making it possible to increase the threshold value. Therefore, this makes it possible to shorten the channel length in an amount corresponding thereto and to obtain a TFT that does not increase an ON resistance. As a result, using the above-mentioned TFT for a display apparatus allows obtaining the display apparatus having a large aperture ratio and having excellent visual recognition characteristics.

DETAILED DESCRIPTION

With reference to the drawings, a thin-film transistor (TFT) according to one embodiment of the disclosure is explained.

Figure 1:
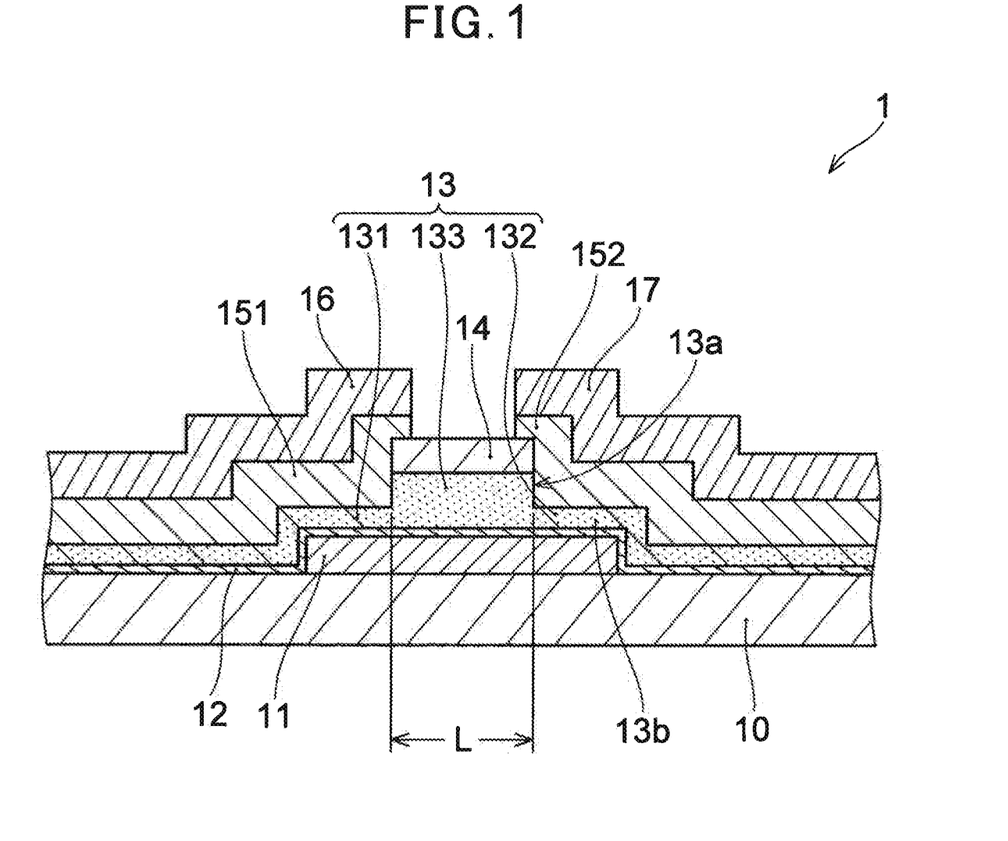
FIG. 1 shows a configuration of a thin-film transistor (TFT) according to one embodiment of the disclosure.

FIG. 1 is a cross-sectional view of the TFT according to one embodiment of the disclosure. As shown in FIG. 1, a TFT 1 according to the embodiment comprises: a gate electrode 11 formed on a substrate 10; a gate insulation layer (a first insulation layer) 12 being formed so as to cover the gate electrode 11; a body layer 13 formed of a semiconductor layer formed on the gate insulation layer 12, the semiconductor layer comprising, above the gate electrode 11, a first region 131, a second region 132, and a channel region 133 positioned therebetween; a channel stopper 14 formed on the channel region 133 of the body layer 13; a first contact layer 151 formed on the first region 131 of the body layer 13; a second contact layer 152 formed on the second region 132 of the body layer 13; a source electrode 16 formed on the first contact layer 151 and electrically connected to the first region 131 via the first contact layer 151; and a drain electrode 17 formed on the second contact layer 152 and electrically connected to the second region 132 via the second contact layer 152. Then, each of the first contact layer 151 and the second contact layer 152 comprises an impurities-containing first amorphous silicon layer being in direct contact to the source electrode 16 or the drain electrode 17; a thickness of each of the first region 131 and the second region 132 of the body layer 13 is less than a thickness of the channel region 133 of the body layer 13; and each of the first region 131 and the second region 132 of the body layer 13 comprises a second amorphous silicon layer containing impurities in the concentration being less than the concentration of impurities contained in the first amorphous silicon layer. In the example in FIG. 1, each of the first contact layer 151 and the second contact layer 152 is the first amorphous silicon layer. The first contact layer 151 and the second contact layer 152 can be the first amorphous silicon layer for the entirety thereof, or can comprise a layer other than the first amorphous silicon layer.

The substrate 10 is a substrate to be an array substrate of a display apparatus, for example, for which array substrate an insulation substrate or an insulation sheet of glass, ceramics, or a resin film is used.

Using an electrical conductor formed of copper (Cu), aluminum (Al), or molybdenum (Mo), for example, a layer of the gate electrode 11 is formed, and the formed layer of the gate electrode 11 is patterned to form the gate electrode 11 in a certain size. In a case of configuring a display apparatus, pixels are formed in a matrix on the substrate 10 and the TFT 1 is formed as a switching device for each of the above-mentioned pixels. At this time, required wirings such as a gate wiring are also formed in connection with the gate electrode 11. Shortening the channel length L and downsizing the gate electrode 11 in relation to the mask precision can also decrease the width of the wiring connected to the gate electrode 11, making it possible to substantially improve the aperture ratio even by slightly shortening the channel length.

The so-called gate insulation layer (first insulation layer) 12 is formed on the gate electrode 11 to the thickness of approximately 0.3 μm to 0.5 μm. As a material for the gate insulation layer 12, silicon oxide (SiOx such as $SiO_2$), silicon nitride (SiNy such as $Si_3N_4$), and silicon oxynitride being a mixture thereof can be listed, and a layer of such a material can be formed using CVD or the like.

While the body layer 13 is formed by deposition of non-doped, or, in other words, intrinsic i a-Si, as described previously, due to diffusion of impurities from the first contact layer 151 and the second contact layer 152, introduction of some amount of impurities occurs in the first region 131 and the second region 132 thereof, so that the first region 131 and the second region 132 are brought to be the second amorphous silicon layer. However, even in such a case, when it is not necessary to make a specific indication, it is to be called a non-doped or intrinsic semiconductor in the specification. The body layer 13 is formed to the thickness of approximately 800 to 1500 Å using plasma CVD or the like.

Following the time of patterning the channel stopper 14 formed on the surface of the body layer 13 or after forming the channel stopper 14, a recess 13a is formed in the body layer 13 by a portion exposed at the opposite ends of the body layer 13 being dug down by etching with the channel stopper 14 as a mask. As a result, the body layer 13 above the gate electrode 11 is segmented into the channel region 133 being an underlayer of the channel stopper 14, and the first region 131 and the second region 132 at the opposite ends thereof. Etching is carried out such that the thickness of each of the first region 131 and the second region 132 of the body layer 13 remaining on the bottom surface of the recess 13a is brought to be approximately 500 Å to 700 Å. In other words, etching is carried out such that approximately 500 Å to 700 Å of the body layer 13 formed to the thickness of approximately 800 Å to 1500 Å is left. Therefore, the thickness of each of the first region 131 and the second region 132 of the body layer 13 is approximately 30% to 70%, preferably approximately 40 to 60%, and more preferably approximately 45% to 55% of that of the channel region 133 of the body layer 13. Explanations will be given in detail below with respect to the thickness to be left as described above.

The channel stopper 14 is formed on the surface of the channel region 133 above the gate electrode 11. The channel stopper 14 is to specify the channel length L, and, in the same manner as the gate insulation layer 12, is formed to the thickness of approximately 0.1 µm to 0.2 µm by a second insulation layer of silicon oxide or silicon nitride. The channel stopper 14 is formed by forming the insulation layer on the entire surface of the body layer 13 and, thereafter, patterning the insulation layer for the channel stopper 14. It is formed by forming a photoresist layer (not shown), then forming a mask with a photolithography process using exposure and development, and etching using the mask. After the above-mentioned channel stopper 14 is formed, etching of the body layer 13 is successively carried out using a mask formed of the above-mentioned resist layer, or with the channel stopper 14 as a mask to form the recess 13a.

Each of the first contact layer 151 and the second contact layer 152 is in direct contact with the source electrode 16 and the drain electrode 17 respectively, comprises a first amorphous silicon layer from which an ohmic contact is obtained (in the example in FIG. 1, each of the first contact layer 151 and the second contact layer 152 is the first amorphous layer), and each of the source electrode 16 and the drain electrode 17 is electrically connected to the semiconductor layer (the first region 131 and the second region 132) via the first contact layer 151 and the second contact layer 152 respectively. In each of the first amorphous semiconductor layer of the first contact layer 151 and the first amorphous semiconductor layer of the second contact layer 152, amorphous silicon (an $n^+$ a-Si layer) in which impurities are doped at, for example, approximately 1E20, at least 1E18 is formed to the thickness of approximately 0.2 µm to 0.5 µm. An $n^+$ a-Si layer (second amorphous silicon film) 15a (see FIG. 2E) to be configured as the first contact layer 151 and the second contact layer 152 is formed by depositing a-Si with an impurities gas such as phosphine ($PH_3$). The second amorphous silicon film 15a comprises the first amorphous silicon layer, and, in the example of FIG. 2E, the second amorphous silicon film 15a consists of the first amorphous silicon layer. Therefore, at the time of forming the $n^+$ a-Si layer 15a, phosphorus (P) ion impurities are introduced also into the body layer 13 thereunder (the first region 131 and the second region 132, in which the channel stopper 14 is not formed), so that a low-concentration region (second amorphous silicon layer) 13b (see FIG. 2E) formed of $n^-$ a-Si of a very low concentration (approximately 3E16) is formed. While the impurities concentration (carrier concentration) means pieces of atoms (carriers) per 1 $cm^3$ (pieces/$cm^3$), the above-mentioned unit will be shown abbreviated in the explanations below.

While the low-concentration region (second amorphous silicon layer) 13b will be explained in detail later, to suppress the photoexcited current, the difference of the impurities concentration thereof relative to the impurities concentration of the first contact layer 151 and the second contact layer 152 (also called merely a contact layer 15 in a case that it is not necessary to distinguish between the two) becomes important, so that the contact layer (the first amorphous silicon layer) 15 having an impurities concentration of approximately 1E20 being formed and the low-concentration region (the second amorphous silicon layer) 13b having an impurities concentration of approximately 3E16 being formed become important. The contact layer 15 and the low-concentration region 13b are formed such that the difference in impurities concentration therebetween is brought to be approximately greater than or equal to 1E2 and less than or equal to 1E4. In other words, the contact layer (the first amorphous silicon layer) 15 is formed such that the impurities concentration thereof is brought to be 1E18 to 1E20, while the low-concentration region (the second amorphous silicon layer) 13b is formed such that the impurities concentration thereof is brought to be greater than or equal to 1E15 and less than or equal to 1E17.

A conductor layer 16a (see FIG. 2E) to be configured as the source/drain electrodes 16, 17 is formed on the surface of the $n^+$ a-Si layer (second amorphous silicon film) 15a to be the contact layer 15, the source electrode 16 and the drain electrode 17 are formed by dividing the conductor layer 16a using etching, and, moreover, the contact layer 15 is also separated into the first contact layer 151 at the source electrode 16 end and the second contact layer 152 at the drain electrode 17 end (see FIG. 1). For the conductor layer 16a to be configured as the source/drain electrodes 16, 17, Cu, Al, W, and Ti, TiN as barrier metals are used, for example.

The low-concentration region (second amorphous silicon layer) 13b is formed by P ions being impurities in the $n^+$ a-Si layer 15a diffusing at the time of forming the $n^+$ a-Si layer (second amorphous silicon film) 15a of the contact layer 15. Therefore, while the impurities concentration of the low-concentration region 13b can also change in accordance with the impurities concentration of the $n^-$ a-Si layer 15a, the $n^+$ a-Si layer 15a is formed such that the impurities concentration thereof is controlled to be brought to be approximately 1E20, or at least 1E18.

As described previously, the TFT using a-Si is known to likely produce the photoexcited current. Therefore, an OFF current, in particular, of the TFT likely differs between a bright place during the day and a dark place at night. In other words, a drain current flows even in an off state when the photoexcited current is present, causing the threshold voltage Vth to decrease. Therefore, the photoexcited current and shortening the channel length are in a conflicting relationship, so that the channel length cannot be shortened. Unless the channel length can be shortened, the aperture ratio cannot be improved. Thus, the inventor first studied the circumstances in which the photoexcited current is produced to suppress the photoexcited current.

Figure 5:
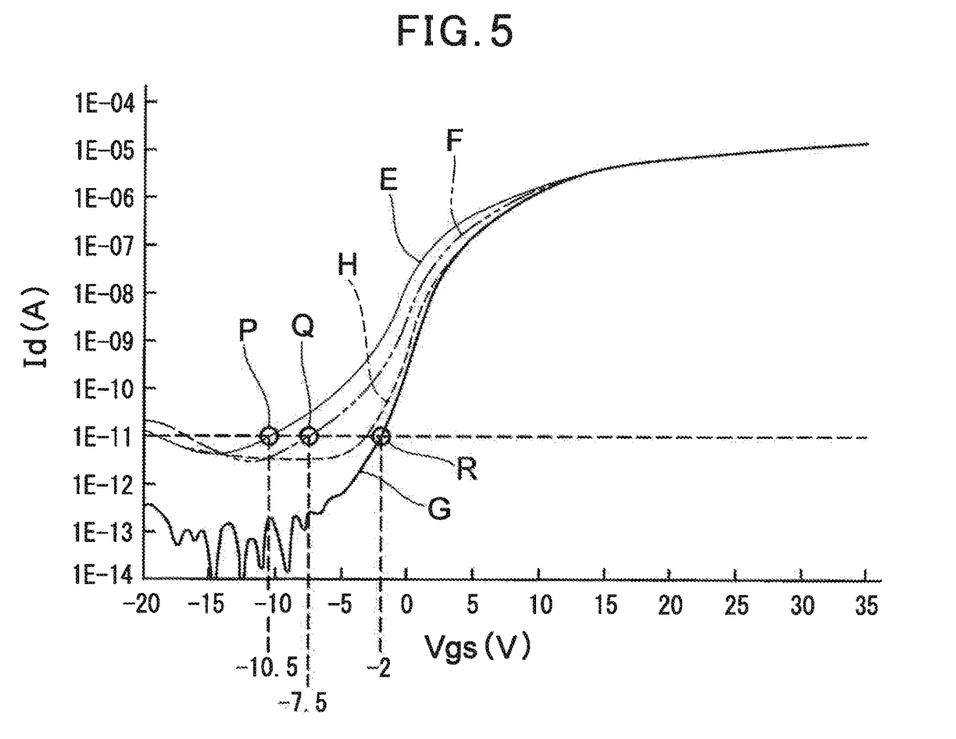
FIG. 5 shows the relationship of the drain current Id relative to the gate voltage Vgs at bright and dark places when an impurities concentration of the body layer is changed.

First, to determine the presence/absence of the photoexcited current, changes in drain current Id relative to the gate voltage Vgs were studied using various TFTs. For the structure of the TFT, not the structure to form the recess by digging down the body layer 13 as in FIG. 1, but a structure in which a contact layer is formed on a flat body layer is adopted. The relationship of the drain current Id relative to the gate voltage Vgs for two types of representative TFTs, the impurities concentrations of which body layer differ, is shown in FIG. 5. In FIG. 5, E and F indicate the relationships at two types of bright places at which the impurities concentrations of the body layer differ. Moreover, G indicates the relationship of current relative to voltage at a dark place. For data sets at dark places differing in impurities concentration of the body layer, current characteristics thereof is almost the same, so that only one line for G is shown therefor. As evident from FIG. 5, at the bright places (E, F), even when the gate voltage Vgs is deepened (increased toward the negative end), the drain current Id does not decrease beyond a certain point, so that approximately 1E-11A is the limit. However, at the dark place (G), deepening the gate voltage Vgs causes the drain current Id to decrease to approximately 1E-13A. In other words, it is seen that, when the photoexcited current is present, the drain current Id undergoes an approximately double-digit increase.

In FIG. 5, the impurities concentration of the body layer of the TFTs falling into group E was measured. The measured impurities concentration was calculated using the following equation from the capacitance value according to general capacitance measurement (C-V measurement):

$$N(a)[1/\text{cm}^3]=2.0/(q \cdot \varepsilon_r \varepsilon_0 \cdot A^2 \cdot [d(1/C^2)/dV])$$

Here, $q=1.602e-19$, $\varepsilon_r$ is the relative permittivity of the semiconductor, $\varepsilon_0$ is the vacuum permittivity, A is the area [cm$^2$], and $[d(1/C^2)/dV]$ is the slope of $1/C^2$ versus V in the CV measurement.

As a result, the impurities concentration of the body layer of the TFTs falling into group E was, on the average, approximately 1E16, while the impurities concentration of the body layer of the TFTs falling into group F was approximately 1.7E16. On the other hand, the gate voltage Vgs of each of groups E and F when the drain current Id in FIG. 5 is 1E-11A, for example, is the gate voltage Vgs at points P and Q in FIG. 5, being approximately −10.5 V at the point P and approximately −7.5V at the point Q, respectively. Then, the relationship of the gate voltage Vgs when the drain current Id is 1E-11A in the above relative to the previously-described impurities concentration is shown in FIG. 6.

Figure 6:
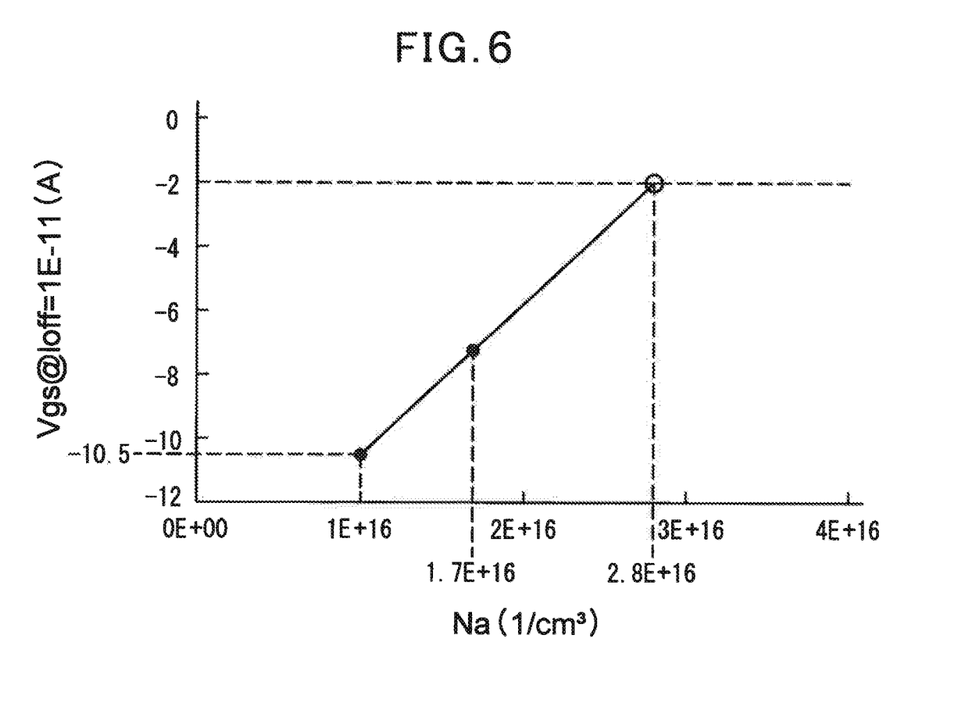
FIG. 6 shows a relationship of the gate voltage Vgs at a constant drain current (Id=1E-11A) relative to the impurities concentration in FIG. 5.

As evident from FIG. 6, it is considered that, with respect to the impurities concentration Na of the body layer and the gate voltage Vgs when the drain current Id is 1E-11A, the greater the impurities concentration Na, the greater the gate voltage Vgs. In other words, it can be seen that, at the bright place, the greater the impurities concentration of the body layer, the greater the gate voltage Vgs to produce the same drain current Id. On the other hand, the gate voltage Vgs when the drain current Id produced at the dark place is 1E-11A, for example, is approximately −2V in view of the point R in FIG. 5. In other words, making the drain current Id produced at the bright place to be the same as the drain current Id produced at the dark place is equivalent to bringing the gate voltage Vgs to produce the drain current Id of 1E-11A at the bright place to −2V. It is considered that the impurities concentration of the body layer at this time be the intersection of a straight line connecting the two points and a straight line when Vgs is −2V in FIG. 6, so that the impurities concentration of the body layer to obtain the characteristics at the bright place being the same as the characteristics at the dark place is inferred to be 2.8E16 from FIG. 6. In short, it can be seen that the impurities concentration of the body layer to join with the above-mentioned contact layer being brought to 2.8E16 when the impurities concentration of the contact layer is 1E20 is effective in suppressing the photoexcited current.

Figure 7:
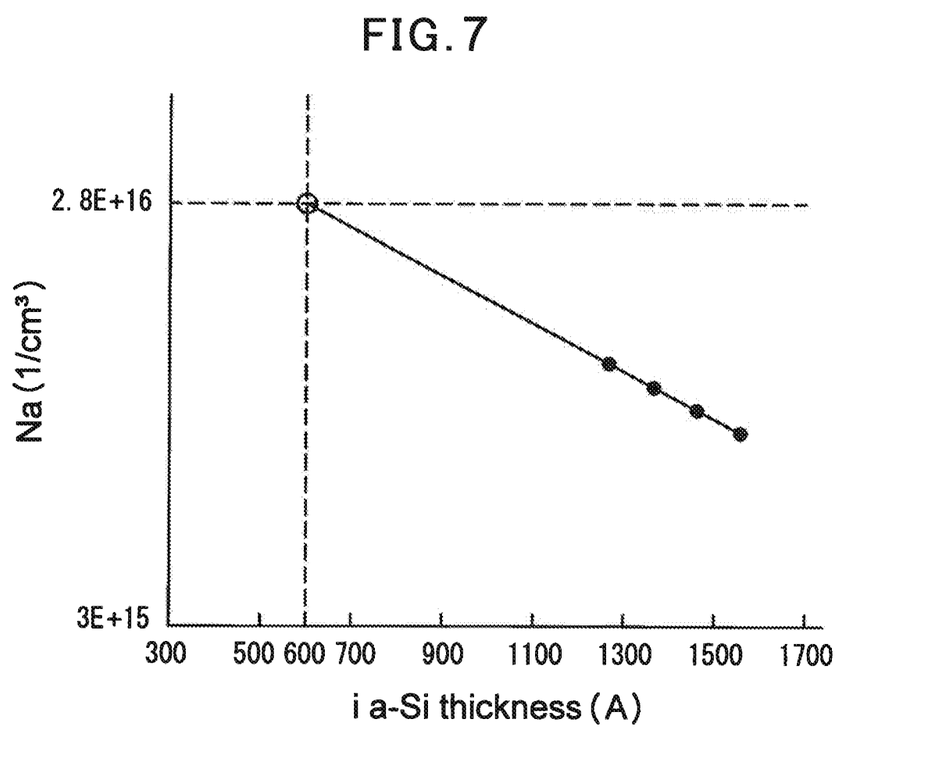
FIG. 7 shows a relationship of the impurities concentration of the body layer relative to a thickness of the body layer being in contact with the contact layer.

On the other hand, the impurities concentration of the body layer to join with the contact layer is formed by introduction (diffusion) of impurities from the contact layer, so that, besides being dependent on the impurities concentration of the contact layer, it is also affected by the thickness of the body layer. While the impurities concentration of the contact layer is controlled to be constant as described previously, it can also change in accordance with the thickness of the body layer, so that the effect due to the thickness of the body layer was studied. In other words, a relationship of the impurities concentration of the body layer 13 relative to the thickness of the body layer 13 in contact with the contact layer 15 being changed variously with the impurities concentration and the thickness of the contact layer 15 being set to be constant is shown in FIG. 7. As evident from FIG. 7, the thicker the body layer the less the impurities concentration of the body layer (i a-Si layer). It is considered that this is because the thicker the body layer the more difficult it is for the impurities to diffuse downward.

The above relationship makes it necessary to bring the thickness of the body layer being in contact with the contact layer to be approximately 600 Å to bring the previously-described impurities concentration of the body layer 13 to be the assumed impurities concentration 2.8E16. On the other hand, the thickness of the body layer (the channel region 133) being little causes the mobility of the impurities to decrease, making it not possible to obtain sufficient on current characteristics. In conjunction therewith, the threshold is shifted in the direction in which the threshold is deeper (the positive end). Therefore, in the TFT according to the embodiment, the thickness of the body layer 13 (in other words, the channel region 133) at the time of deposition is set to be approximately 800 to 1500 Å.

Then, according to the embodiment, as shown in FIG. 1, the thickness of the body layer 13 at the time of deposition is brought to be approximately 800 to 1500 Å and the body layer 13 under the source/drain electrodes 16, 17 is dug to leave only approximately 500 to 700 Å, preferably 550 to 650 Å, and more preferably 580 to 620 Å of each of the first region 131 and the second region 132. This results in an optimal difference in impurities concentration on the surface joining the contact layer 15 and the body layer 13, making it possible to sufficiently suppress the photoexcited current, and, even more, results in the body layer 13 formed to a thickness being sufficient to allow maintaining an on current at the channel region 133 of the body layer 13. The low-concentration region 13b is formed such that the impurities concentration of the contact layer (first amorphous silicon layer) 15 is brought to be greater than or equal to 100 times and less than or equal to 10000 times, preferably greater than or equal to 1000 times and less than or equal to 10000 times, and more preferably greater than or equal to 6000 times and less than or equal to 8000 times the impurities concentration of the joining surface of the first and second regions (second amorphous silicon layer) 131, 132 of the body layer. This results in suppressing the photoexcited current, causing the threshold voltage to increase, and causing the channel length L of the channel region 133 to be reduced, which, however, does not cause the threshold voltage Vth to decrease beyond returning to the original level.

Suppressing the photoexcited current can cause the channel length L to be reduced by a few μm, and, in conjunction therewith, can also cause the width of a wiring connected to the TFT to be reduced, making it possible to substantially improve the aperture ratio. In other words, a light shielding region associated with the TFT can be reduced by approximately 70% relative to that of the conventional structure, making it possible to improve the aperture ratio by approximately 32%.

Figure 8:
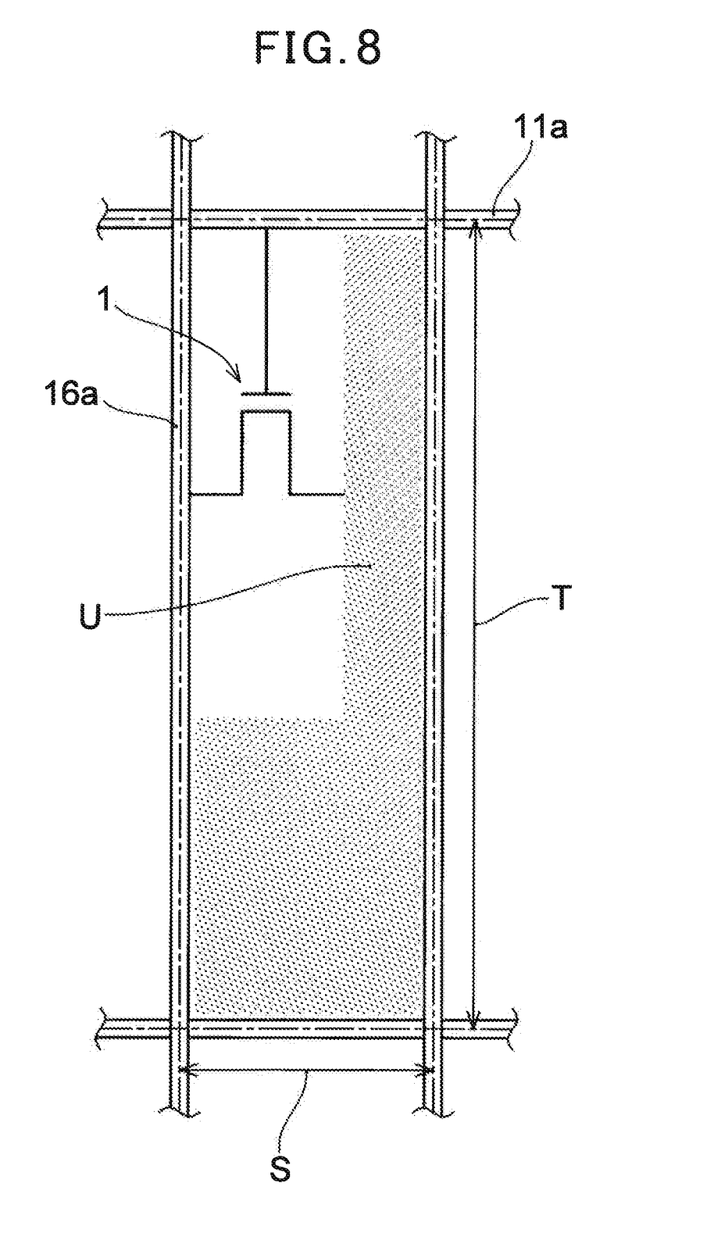
FIG. 8 shows a schematic plan view of one pixel of a 60-inch 4K television, which schematic plan view explains a change in aperture ratio.

In other words, as shown with a schematic plan view of one pixel of a 60-inch 4K television in FIG. 8, with respect to one pixel, the sum of a region surrounded by two gate line 11a and two data lines 16a and a half of a region of wirings corresponds to the area of the one pixel. The letter 1 in FIG. 8 indicates a thin-film transistor (TFT), while a region U indicated with dots is a region of a pixel electrode, or, in other words, a display region. With this size, a lateral length S of the one pixel is 110 μm, while a vertical length T thereof is 350 μm. Therefore, the area of the one pixel is 110×350=38500 (p With the conventional structure, the area occupied by the TFT 1 and a half of the wirings 11a and 16a of the above-mentioned area of the one pixel is equal to 20840 μm². Therefore, the aperture ratio in the conventional structure is 46%. Contrarily thereto, according to the embodiment, the gate length is reduced by 70% and the wirings are also reduced by 50%. This results in the area occupied by the TFT 1 and a half of the wirings 11a and 16a of the above-mentioned area of the one pixel is brought to be equal to 20840×0.4, causing the aperture ratio to increase to 78%. Therefore, compared with the conventional structure, the aperture ration increases by approximately 32%.

Next, a manufacturing method for the above-mentioned TFT is explained with reference to FIGS. 2A to 2E.

Figure 2A:
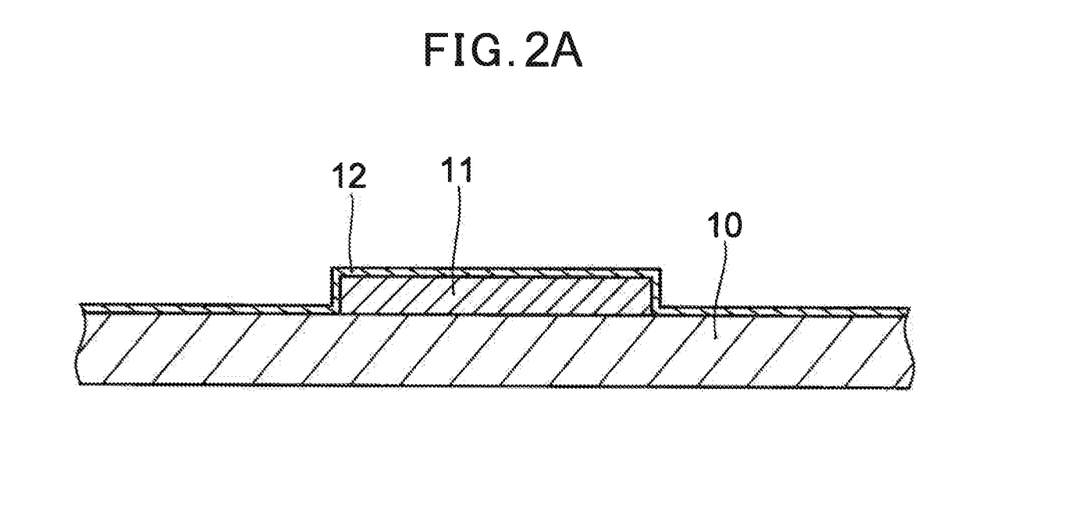
FIG. 2A shows a manufacturing process of the TFT in FIG. 1.

First, as shown in FIG. 2A, the gate electrode 11 is formed on the substrate 10, and the first insulation layer 12 being a gate insulation layer is formed so as to cover the surface of the gate electrode 11. The gate electrode 11 is formed by forming a conductor layer on the entire surface of the substrate 10 and patterning the formed conductor layer. In a case of configuring a display apparatus, a gate wiring (not shown) connected to the gate electrode 11 and an auxiliary capacitance electrode are similarly formed by patterning.

Figure 2B:
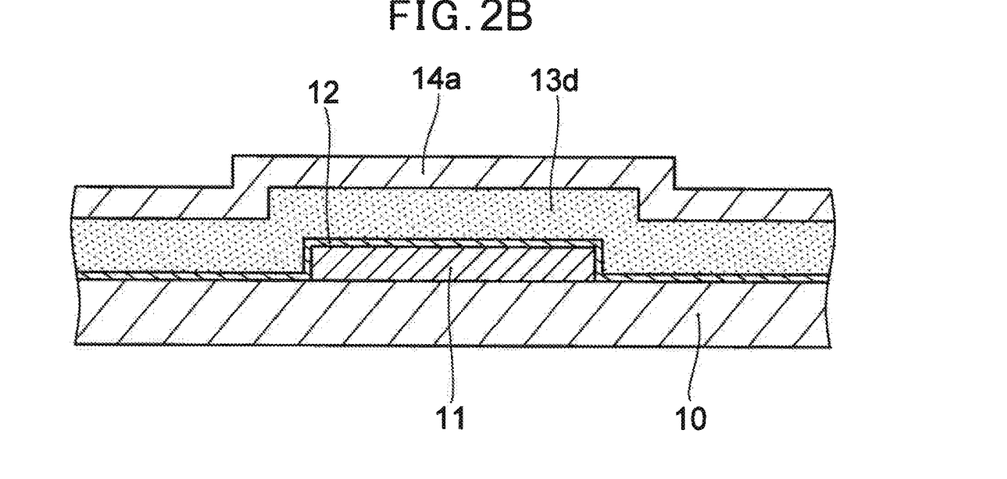
FIG. 2B shows a manufacturing process of the TFT in FIG. 1.

Next, as shown in FIG. 2B, a non-doped i a-Si layer (first amorphas silicon film) 13d to be configured as the body layer 13 is formed on the entire surface of the substrate 10, and thereover a second insulation layer 14a to be configured as a channel stopper is formed.

Figure 2C:
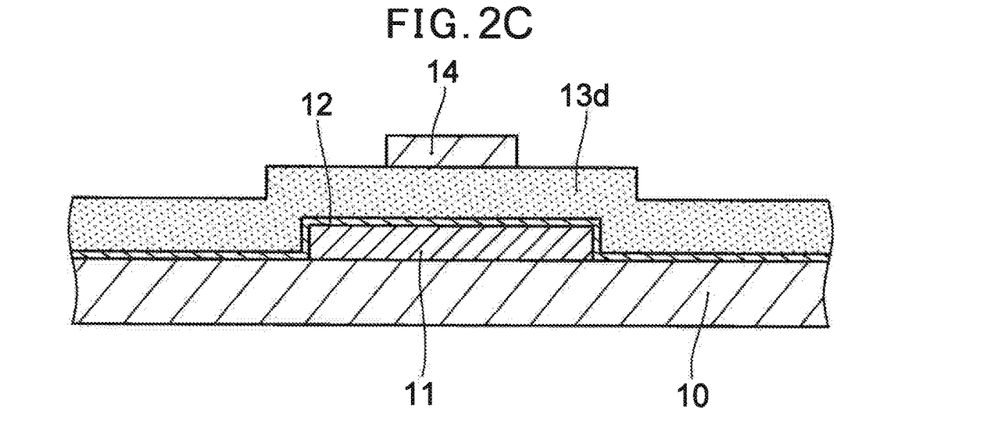
FIG. 2C shows a manufacturing process of the TFT in FIG. 1.

Next, as shown in FIG. 2C, the channel stopper 14 is formed by patterning the second insulation layer 14a. The channel stopper 14 is formed by patterning in alignment with the channel length needed. The patterning, in the same manner as the normal patterning, can be carried by forming a resist layer, forming a mask by exposure and development of the formed resist layer, and etching the second insulation layer 14a using the mask formed.

Figure 2D:
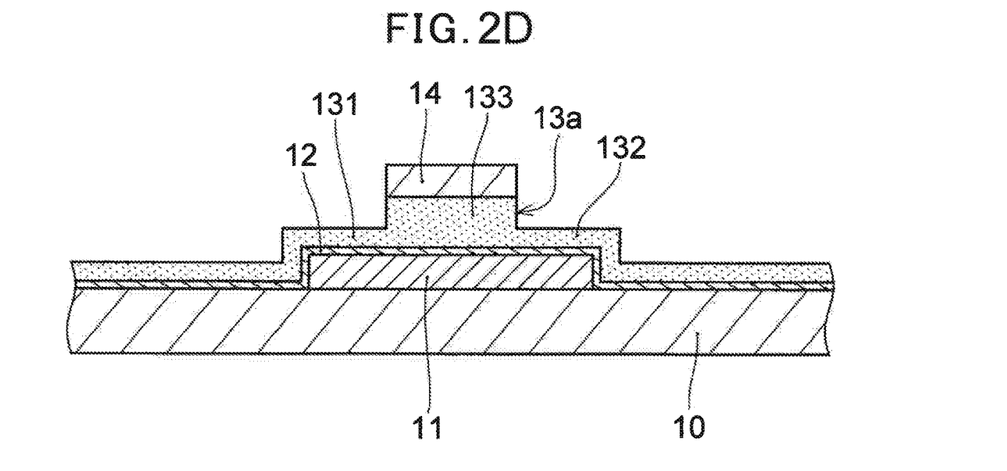
FIG. 2D shows a manufacturing process of the TFT in FIG. 1.

Thereafter, as shown in FIG. 2D, using $Cl_2/HBr/O_2$ gas, for example, as an etchant, the i a-Si layer 13d is etched by dry etching with the resist layer at the time of forming the channel stopper 14 or the etching stopper 14 as a mask. This results in the channel region 133 being the underlayer of the channel stopper 14, and the first region 131 and the second region 132 formed at the opposite ends thereof. While portions in which no TFT is formed are all removed at this time, etching is carried out such that an i a-Si layer having the thickness of approximately 600 Å remains at the opposite ends of the channel region 133. As a result, the recess 13a is formed beside the channel region 133.

Figure 2E:
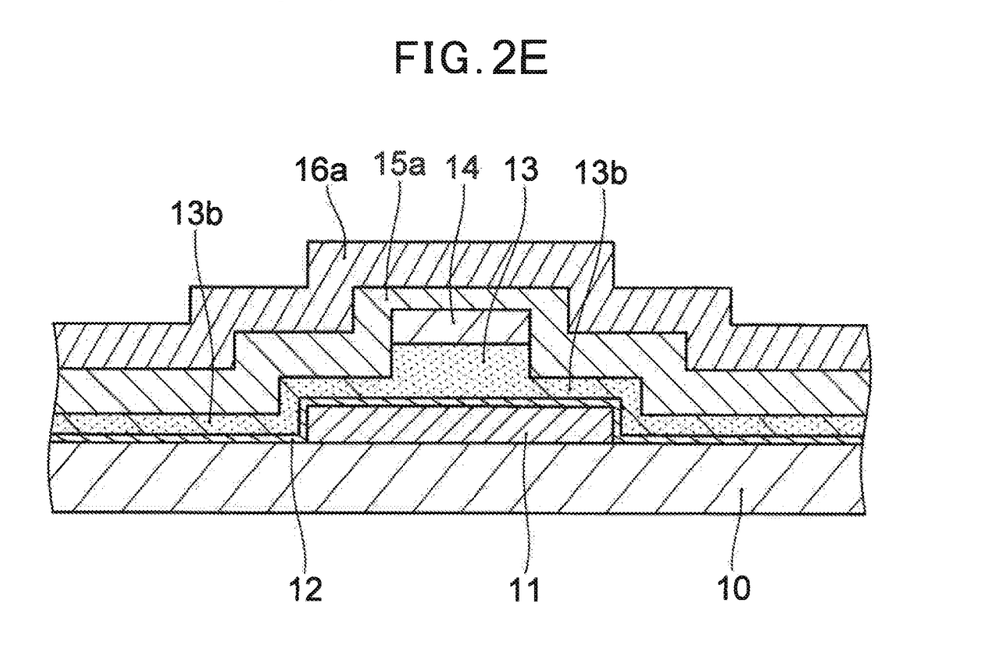
FIG. 2E shows a manufacturing process of the TFT in FIG. 1.

Thereafter, as shown in FIG. 2E, the $n^+$ a-Si layer (second amorphous silicon film) 15a to be configured as the contact layer 15 and the conductor layer 16a to be configured as the source/drain electrodes 16, 17 are deposited.

Thereafter, the conductor layer 16a and the $n^+$ a-Si layer 15a are divided on the etching stopper 14 to cause the source electrode 16 and the drain electrode 17 to be separated from each other, and to also the cause the second amorphous silicon film 15a to be separated into the first contact layer (first amorphous silicon layer) 151 for the source electrode 16 and the second contact layer (first amorphous silicon layer) 152 for the drain electrode 17. As a result, the TFT 1 shown in FIG. 1 is obtained.

Figure 3:
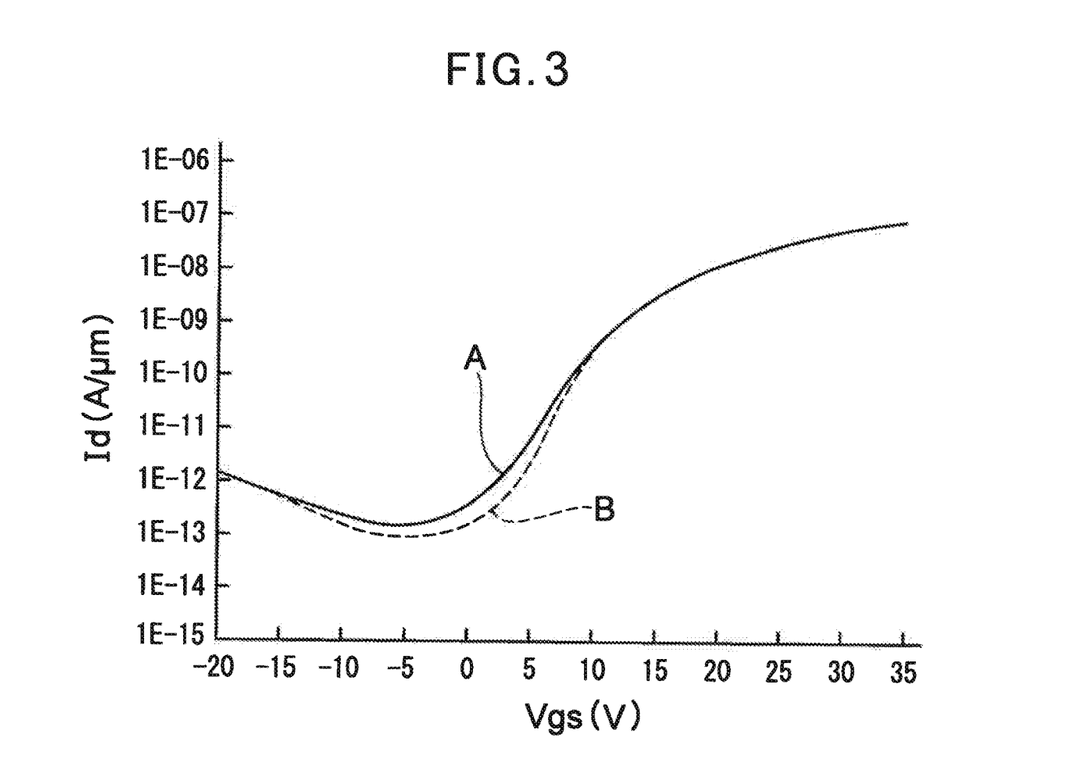
FIG. 3 shows a relationship of a drain current Id relative to a gate voltage Vgs of the TFT according to one embodiment of the disclosure.

The relationship of the drain current Id relative to the gate voltage Vgs of the TFT thus formed is shown in FIG. 3. A in FIG. 3 indicates measurement data at a bright place, while B therein indicates measurement data at a dark place. As evident from FIG. 3, it can be seen that there is almost no difference in drain current Id between the bright place and the dark place even with respect to a deep gate voltage (a voltage having a large negative magnitude) and that the photoexcited current is suppressed. This results in the threshold voltage Vth to increase, so that no short channel effect occurs even when the channel length L is shortened, thus making it possible to shorten the channel length L.

Figure 4A:
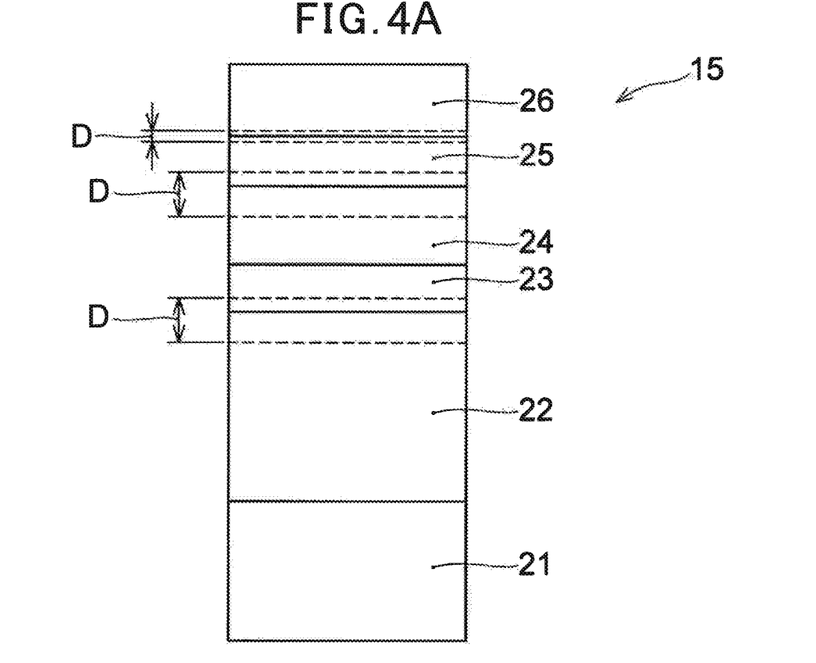
FIG. 4A shows a variation of a structure in FIG. 1, wherein the variation is one example of a deposition structure inserted between a contact layer and a body layer in FIG. 1.
Figure 4B:
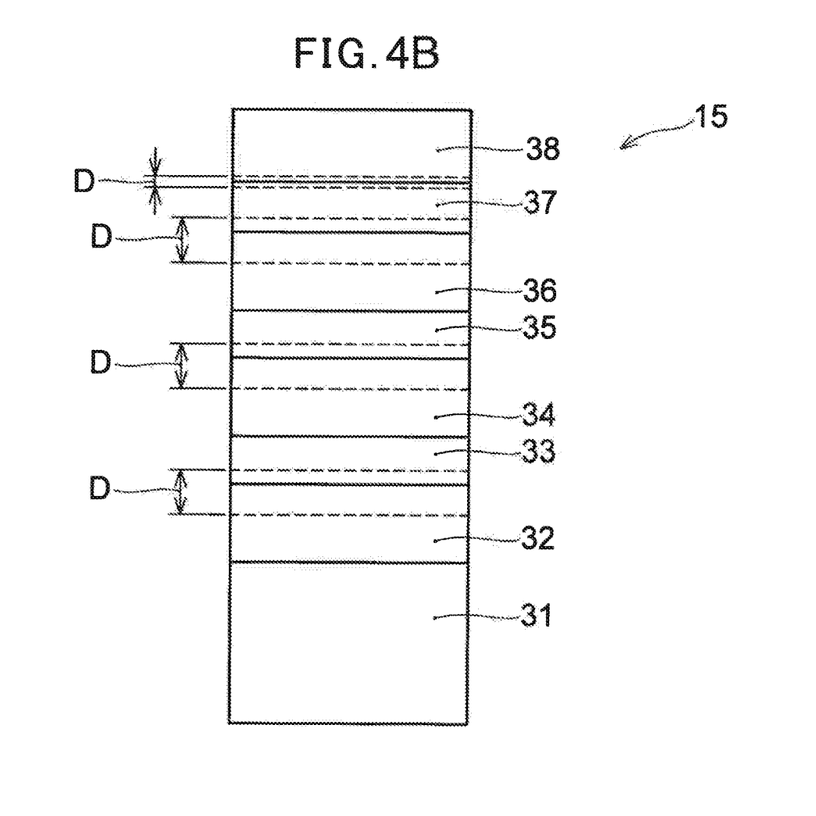
FIG. 4B shows a variation of the structure in FIG. 1, wherein the variation is another example of the deposition structure inserted between the contact layer and the body layer in FIG. 1.

Each of FIGS. 4A and 4B shows a variation of the contact layer 15 of the structure under the source/drain electrodes in FIG. 1, wherein the variation represents sets of a third amorphous silicon layer formed of an $n^+$ a-Si layer having a concentration being lower than that of the previously-described first amorphous silicon layer and higher than that of the second amorphous silicon layer and a fourth amorphous silicon layer formed of a non-doped i a-Si layer being configured in a deposition structure. Configuring such a structure provides an effect that a depletion layer D increases and an OFF current decreases. Moreover, with an increase in the number of sets as mentioned above, the threshold voltage Vth moves toward the positive end, causing the TFT characteristics to further improve. The above-mentioned movement of the threshold voltage Vth toward the positive end was more prominent with the structure shown in FIG. 4B in which there are more deposition structures with respect to the structure shown in FIG. 4A. In other words, the contact layer 15 is formed by at least one set of deposition structure of the third amorphous silicon layer and the fourth amorphous silicon layer being formed between the bottom surface of the recess 13a of the body layer 13 and the source electrode 16 or the drain electrode 17.

With the structure shown in FIG. 4A, the contact layer 15 is formed by depositing, from the body layer 13 end, each of approximately 550 Å of an $n^+$ a-Si layer (third amorphous silicon layer) 21 having the impurities concentration of 5E18, approximately 700 Å of an i a-Si layer (fourth amorphous silicon layer) 22, approximately 100 Å of an $n^+$ a-Si layer (third amorphous silicon layer) 23 having the impurities concentration of 5E18, approximately 150 Å of an i a-Si layer (fourth amorphous silicon layer) 24, and approximately 100 Å of an $n^+$ a-Si layer (third amorphous silicon layer) 25 having the impurities concentration of 5E18, and depositing thereon approximately 150 Å of an $n^+$ a-Si layer (first amorphous silicon layer) 26 having the impurities concentration of 1E20. In other words, the impurities concentration of the n⁺ a-Si layer (third amorphous silicon layer) is 1E17 to 1E19, so that it is less than the impurities concentration of the first amorphous silicon layer.

The depletion layer D having the thickness of approximately 102 Å is formed on the surface joining the i a-Si layer 22 and the n⁺ a-Si layer 23. Moreover, the depletion layer D having the thickness of approximately 102 Å is formed on the surface joining the i a-Si layer 24 and the n⁺ a-Si layer 25 and, furthermore, the depletion layer D having the thickness of approximately 10 Å is formed on the surface joining the n⁺ a-Si layer 25 and the n⁺ a-Si layer 26 (first amorphous silicon layer) 26. The depletion layer D is formed to the width of approximately 80 to 200 Å, preferably to the thickness of approximately 90 to 110 Å, depending on the difference in the impurities concentration of layers to be joined. Configuring such a deposition structure allows increasing the summed depletion layer thickness and, moreover, diffusion of impurities from the high-concentration layer of the undermost layer causes the impurities concentration in the a-Si layer to be brought to be high, so that the photoexcited current is suppressed, and the threshold voltage Vth also moves in the positive direction, so that it is improved by approximately 8V. Moreover, the depletion layer being formed at the joining interface causes an off current to be suppressed, providing a high photostability effect and causing a TFT having excellent on/off characteristics to be obtained.

FIG. 4B shows a structure in which one more stage is added to the above-mentioned deposition structure. In other words, the contact layer 15 is formed by depositing each of approximately 300 Å of an n⁺ a-Si layer (third amorphous silicon layer) 31 having the impurities concentration of 5E18, approximately 150 Å of an i a-Si layer (fourth amorphous silicon layer) 32, approximately 100 Å of an a-Si layer (third amorphous silicon layer) 33 having the impurities concentration of 5E18, approximately 150 Å of an i a-Si layer (fourth amorphous silicon layer) 34, approximately 100 Å of an n⁺ a-Si layer (third amorphous silicon layer) 35 having the impurities concentration of 5E18, approximately 150 Å of an i a-Si layer (fourth amorphous silicon layer) 36, and approximately 100 Å of an n⁻ a-Si layer (third amorphous silicon layer) 37 having the impurities concentration of 5E18, and depositing thereon approximately 150 Å of an n⁺ a-Si layer (first amorphous silicon layer) 38 having the impurities concentration of 1E20.

The depletion layer D having the thickness of approximately 102 Å is formed on the surface joining the i a-Si layer 32 and the n⁺ a-Si layer 33 mentioned above. Moreover, the depletion layer D having the thickness of approximately 102 Å is also formed on the surface joining the i a-Si layer 34 and the n⁺ a-Si layer 35 and, furthermore, the depletion layer D having the thickness of approximately 102 Å is also formed on the surface joining the i a-Si layer 36 and the n⁺ a-Si layer 37. Moreover, the depletion layer D having the thickness of approximately 10 Å is also formed on the surface joining the n⁺ a-Si layer 37 and the n⁺ a-Si layer 38. Such three sets of the i a-Si layer and the n⁺ a-Si layer are deposited to allow the Vth to improve by approximately 12V, causing a TFT having even higher photostability and excellent on/off characteristics to be obtained.

Conclusion (1) A thin-film transistor according to one embodiment of the disclosure comprises: a substrate; a gate electrode supported by the substrate; a gate insulation layer to cover the gate electrode; a body layer formed of a semiconductor layer formed on the gate insulation layer, the body layer comprising, above the gate electrode, a first region, a second region, and a channel region positioned between the first region and the second region; a channel stopper formed on the channel region of the body layer; a first contact layer formed on the first region of the body layer; a second contact layer formed on the second region of the body layer; a source electrode formed on the first contact layer and electrically connected to the first region via the first contact layer; and a drain electrode formed on the second contact layer and electrically connected to the second region via the second contact layer, wherein each of the first contact layer and the second contact layer comprises an impurities-containing first amorphous silicon layer being in direct contact to the source electrode or the drain electrode; a thickness of each of the first region and the second region of the body layer is less than a thickness of the channel region of the body layer; and each of the first region and the second region of the body layer comprises a second amorphous silicon layer containing impurities in a concentration being less than a concentration of impurities contained in the first amorphous silicon layer.

One embodiment of the disclosure allows the photoexcited current to be suppressed and the threshold voltage to improve. Even more, a sufficient thickness is maintained for the thickness of the body layer in the channel region. This makes it possible to shorten the channel length and downsize the transistor and the wiring thereof. Even more, an ON resistance can also be reduced sufficiently. Therefore, configuring a display apparatus allows substantially improving the aperture ratio and obtaining a display apparatus having excellent visual recognition characteristics.

(2) In the thin-film transistor according to (1) in the above, the channel region of the body layer is preferably formed of non-doped amorphous silicon (i a-Si). This makes it possible to easily form a TFT having stable characteristics even for an array substrate having a large size, such as 10G (10th generation).

(3) In the thin-film transistor according to (1) or (2) in the above, a lower surface of each of the first contact layer and the second contact layer is preferably located nearer to the gate electrode with respect to an upper surface of the channel region of the body layer. This is because it can be made thinner than the channel region of the body layer.

(4) In the thin-film transistor according to any one of (1) to (3) in the above, the thickness of each of the first region and the second region of the body layer is preferably 30% to 70% of the thickness of the channel region of the body layer. This is because the impurities concentration of the body layer is easily controlled in an optimal manner.

(5) In the thin-film transistor according to any one of (1) to (4) in the above, a concentration of impurities contained in the second amorphous silicon layer is preferably 1E15 (pieces/cm³) to 1E17 (pieces/cm³). This is because the photoexcited current can be suppressed effectively.

(6) In the thin-film transistor according to any one of (1) to (5) in the above, the concentration of impurities contained in the first amorphous silicon layer is preferably 1E18 (pieces/cm³) to 1E20 (pieces/cm³). This is because the photoexcited current can be suppressed effectively.

(7) In the thin-film transistor according to any one of (1) to (6) in the above, the concentration of impurities contained in the first amorphous silicon layer is preferably greater than or equal to 100 times and less than or equal to 10000 times the concentration of impurities contained in the second amorphous silicon layer. This is because the photoexcited current can be suppressed effectively.

(8) In the thin-film transistor according to any one of (1) to (7) in the above, each of the first contact layer and the second contact layer preferably comprises at least one of a set of a third amorphous silicon layer and a non-doped fourth amorphous silicon layer, the third amorphous silicon layer containing impurities in a concentration being less than the concentration of impurities contained in the first amorphous silicon layer and being greater than the concentration of impurities contained in the second amorphous silicon layer. This is because an off current can be reduced further.

(9) In the thin-film transistor according to (8) in the above, a thickness of a depletion layer formed at an interface between the third amorphous silicon layer and the fourth amorphous silicon layer is preferably 90 Å to 110 Å without applying a voltage.

(10) In the thin-film transistor according to (8) in the above, the concentration of impurities contained in the third amorphous silicon layer is preferably 1E17 (pieces/cm$^3$) to 1E19 (pieces/cm$^3$).

(11) A manufacturing method for a thin-film transistor being another embodiment of the disclosure comprises: forming a gate electrode and a first insulation layer, in this order, on a substrate; depositing, on the first insulation layer, a first amorphous silicon film, and a second insulation layer in this order, which first amorphous silicon film is non-doped; forming a channel stopper by patterning the second insulation layer on a portion of the first amorphous silicon film, which portion is to be a channel region; forming a recess in the first amorphous silicon film by etching a portion of the first amorphous silicon film, which portion is not covered by the channel stopper, thereby forming, above the gate electrode, a body layer from the first amorphous silicon film, which body layer comprises a first region, a second region, and the channel region being positioned between the first region and the second region, a thickness of which channel region is greater than a thickness of each of the first region and the second region; depositing a second amorphous silicon film comprising a first amorphous silicon layer above the body layer and the channel stopper, which first amorphous silicon layer is impurities-containing; depositing a conductor layer on the second amorphous silicon film; and forming, from the second amorphous silicon film, a first contact layer being positioned on the first region and a second contact layer being positioned on the second region, and forming, from the conductor layer, a source electrode being in direct contact with the first amorphous silicon layer of the first contact layer and being electrically connected to the first region via the first contact layer and a drain electrode being in direct contact with the first amorphous silicon layer of the second contact layer and being electrically connected to the second region via the second contact layer, by patterning the conductor layer and the second amorphous silicon film.

This method allows forming a suitable impurities concentration difference on the surface joining the contact layer and first and second regions of the body layer and effectively suppressing the photoexcited current.

(12) In the above manufacturing method for a thin-film transistor, it is preferable that the channel region of the body layer is formed of non-doped amorphous silicon; and each of the first region and the second region of the body layer comprises the second amorphous silicon layer containing impurities in a concentration being less than a concentration of the first amorphous silicon layer.

(13) In the above manufacturing method for a thin-film transistor, a concentration of impurities contained in the first amorphous silicon layer is preferably 1E18 (pieces/cm$^3$) to 1E20 (pieces/cm$^3$).

What is claimed is:

1. A thin-film transistor comprising:
a substrate;
a gate electrode supported by the substrate;
a gate insulation layer to cover the gate electrode;
a body layer formed of a semiconductor layer formed on the gate insulation layer, the body layer comprising, above the gate electrode, a first region, a second region, and a channel region positioned between the first region and the second region;
a channel stopper formed on the channel region of the body layer;
a first contact layer formed on the first region of the body layer;
a second contact layer formed on the second region of the body layer;
a source electrode formed on the first contact layer and electrically connected to the first region via the first contact layer; and
a drain electrode formed on the second contact layer and electrically connected to the second region via the second contact layer, wherein
each of the first contact layer and the second contact layer comprises an impurities-containing first amorphous silicon layer being in direct contact with the source electrode or the drain electrode;
a thickness of each of the first region and the second region of the body layer is less than a thickness of the channel region of the body layer; and
each of the first region and the second region of the body layer comprises a second amorphous silicon layer containing impurities in a concentration being less than a concentration of impurities contained in the first amorphous silicon layer.

2. The thin-film transistor according to claim 1, wherein the channel region of the body layer is formed of non-doped amorphous silicon.

3. The thin-film transistor according to claim 1, wherein a lower surface of each of the first contact layer and the second contact layer is located closer to the gate electrode with respect to an upper surface of the channel region of the body layer.

4. The thin-film transistor according to claim 1, wherein the thickness of each of the first region and the second region of the body layer is 30% to 70% of the thickness of the channel region of the body layer.

5. The thin-film transistor according to claim 1, wherein the concentration of impurities contained in the second amorphous silicon layer is 1E15 (pieces/cm$^3$) to 1E17 (pieces/cm$^3$).

6. The thin-film transistor according to claim 1, wherein the concentration of impurities contained in the first amorphous silicon layer is 1E18 (pieces/cm$^3$) to 1E20 (pieces/cm$^3$).

7. The thin-film transistor according to claim 1, wherein the concentration of impurities contained in the first amorphous silicon layer is greater than or equal to 100 times and less than or equal to 10000 times the concentration of impurities contained in the second amorphous silicon layer.

8. The thin-film transistor according to claim 1, wherein each of the first contact layer and the second contact layer comprises at least one of a set of a third amorphous silicon layer and a non-doped fourth amorphous silicon layer, the third amorphous silicon layer containing impurities in a concentration being less than the concentration of impurities contained in the first amorphous silicon layer and being greater than the concentration of impurities contained in the second amorphous silicon layer.

9. The thin-film transistor according to claim 8, wherein a thickness of a depletion layer formed at an interface between the third amorphous silicon layer and the fourth amorphous silicon layer is 90 Å to 110 Å without applying a voltage.

10. The thin-film transistor according to claim 8, wherein the concentration of impurities contained in the third amorphous silicon layer is 1E17 (pieces/cm$^3$) to 1E19 (pieces/cm$^3$).

11. The thin-film transistor according to claim 1, wherein the gate electrode is formed only below the body layer, thereby the thin-film transistor having a single gate structure.

12. The thin-film transistor according to claim 1, wherein a portion of each of the first contact layer and the second contact layer, which portion is in contact to the second amorphous silicon layer, is a highly-doped amorphous silicon layer.

\* \* \* \* \*